United States Patent
Choi et al.

(10) Patent No.: US 8,588,337 B2
(45) Date of Patent: Nov. 19, 2013

(54) VECTOR MODULATOR

(75) Inventors: Heon soo Choi, Gwangmyeong-si (KR);
Chang su Choi, Yongin-si (KR); Hyung jun Jeon, Hwaseong-si (KR); Yeong chan Kim, Seoul (KR); Jae hwan Im, Gwangmyeongsi (KR); Jung ki Ruy, Anyang-si (KR)

(73) Assignee: LS Industrial Systems Co., Ltd., Anyang-Si, Gyeonggi-Do (KR)

( * ) Notice: Subject to any disclaimer, the term of this patent is extended or adjusted under 35 U.S.C. 154(b) by 4 days.

(21) Appl. No.: 13/576,624

(22) PCT Filed: Jan. 31, 2011

(86) PCT No.: PCT/KR2011/000659
§ 371 (c)(1),
(2), (4) Date: Aug. 1, 2012

(87) PCT Pub. No.: WO2011/096689
PCT Pub. Date: Aug. 11, 2011

(65) Prior Publication Data
US 2012/0294388 A1    Nov. 22, 2012

(30) Foreign Application Priority Data
Feb. 3, 2010 (KR) .................... 10-2010-0009896

(51) Int. Cl.
*H04L 27/20* (2006.01)

(52) U.S. Cl.
USPC .......................................................... 375/308

(58) Field of Classification Search
USPC ................. 375/261, 295, 308, 324, 332, 353
See application file for complete search history.

(56) References Cited

U.S. PATENT DOCUMENTS

| | | | | |
|---|---|---|---|---|
| 5,355,103 A | * | 10/1994 | Kozak | 333/81 R |
| 5,392,009 A | * | 2/1995 | Talwar | 333/81 R |
| 6,853,691 B1 | * | 2/2005 | Kim | 375/308 |
| 2005/0152469 A1 | * | 7/2005 | Fusco et al. | 375/295 |
| 2006/0181344 A1 | * | 8/2006 | Ksienski et al. | 330/124 R |
| 2007/0178859 A1 | * | 8/2007 | Sorrells et al. | 455/127.3 |
| 2008/0143443 A1 | | 6/2008 | Gilbert | |

FOREIGN PATENT DOCUMENTS

| | | |
|---|---|---|
| KR | 10-2000-0039236 | 7/2000 |
| KR | 10-1042396 | 6/2011 |

* cited by examiner

*Primary Examiner* — Sam K Ahn
*Assistant Examiner* — Syed Haider
(74) *Attorney, Agent, or Firm* — Lee, Hong, Degerman, Kang & Waimey

(57) ABSTRACT

Disclosed is a vector modulator. The vector modulator can control the amplitude and phase of an input signal, by not using amplitude variable attenuators but using phase shifters. Further, the vector modulator has a simple configuration and enables an input signal to be exactly modulated. Furthermore, the vector modulator can modulate the phase of an input signal throughout all areas in the polar coordinate system.

5 Claims, 5 Drawing Sheets

(a)

(b)

VECTOR MODULATOR

CROSS-REFERENCE TO RELATED APPLICATIONS

This application is the National Stage filing under 35 U.S.C. 371 of International Application No. PCT/KR2011/000659, filed on Jan. 31, 2011, which claims the benefit of earlier filing date and right of priority to Korean Application No. 10-2010-0009896, filed on Feb. 3, 2010, the contents of which are all incorporated by reference herein in their entirety.

TECHNICAL FIELD

The present invention relates to a vector modulator, and more particularly, to a vector modulator for use in a measuring system.

BACKGROUND ART

In general, a vector modulator is a device that is used in a measuring machine and an amplifier, so as to simultaneously control the amplitude and phase of a signal. The vector modulator converts an input signal into an in-phase (I) channel signal and a quadrature (Q) channel signal, which have a phase difference of 90 degrees. The I/Q channel signals are output in the state in which the amplitude of each of the I/Q channel signals is not changed, but only the phase of each of the I/Q channel signals is changed depending on an external control signal. The output signals are attenuated with a certain attenuation rate by an amplitude variable attenuator and then output as a vector sum of the attenuated signals.

However, a conventional vector modulator generates four uppermost signals and variably controls the amplitude of each uppermost signal using an amplitude variable attenuator. Then, the conventional vector modulator outputs a vector sum obtained by combining the uppermost signals. In this case, the amplitude variable attenuator is necessarily required in the conventional vector modulator, and therefore, the circuit configuration of the conventional vector modulator is complicated.

In order to use the amplitude variable attenuator, the conventional vector modulator has a disadvantage in that I/Q channel signals should be respectively converted into amplitude control values so as to obtain an arbitrary phase angle. The conventional vector modulator has a problem in that the process of obtaining a phase angle output as a final vector sum is complicated.

Further, a conventional single vector modulator has a problem in that the modulation phase of a modulator is changed into two unit vectors having angles of 0 and 180 degrees, and therefore, the phase of an input signal cannot be converted into all areas in the polar coordinate system.

DISCLOSURE

Technical Problem

The present invention is conceived to solve the aforementioned problems. Accordingly, an object of the present invention is to provide a vector modulator capable of the amplitude and phase of an input signal, not using amplitude variable attenuators but using phase shifters.

Another object of the present invention is to provide a vector modulator which has a configuration simpler than the conventional vector modulation and enables an input signal to be exactly modulated.

Still another object of the present invention is to provide a vector modulator capable of modulating the phase of an input signal throughout all areas in the polar coordinate system.

Technical Solution

According to an aspect of the present invention, there is provided a vector modulator, including: first and second phase shifters configured to respectively shift the phases of in-phase (I) and quadrature (Q) channel signals constituting an input signal within a predetermined phase range; a first coupler configured to convert the I channel signal output from the first phase shifter into first and second channel signals having a phase difference of 90 degrees with each other; a second coupler configured to convert the Q channel signal output from the second phase shifter into third and fourth channel signals having a phase difference of 90 degrees with each other; third and fourth phase shifters configured to respectively shift the phases of the first and second channel signals output from the first coupler within a predetermined phase range; fifth and sixth phase shifters configured to respectively shift the phases of the third and fourth channel signals output from the second coupler within a predetermined phase range; a first combiner configured to combine the first and second channel signals having the shifted phases, output from the respective third and fourth phase shifters; a second combiner configured to combine the third and fourth channel signals having the shifted phases, output from the respective fifth and sixth phase shifters; and a third combiner configured to combine output signals respectively output from the first and second couplers.

Each of the first to sixth phase shifters may shift the phase of a signal input thereto while maintaining the amplitude of the signal as it is.

Each of the first to sixth phase shifters may shift the phase of a signal input thereto within a phase range of 0 to 90 degrees.

Each of the first to third combiners may combine signals input thereto as a vector sum.

Each of the first and second couplers may be a 90-degree hybrid coupler.

Advantageous Effects

According to the present invention, the vector modulator does not use amplitude variable attenuators but uses only phase shifters, so that it is possible to simplify the configuration of a system.

Further, since an amplitude control is not performed, the modulation of a signal can be easily performed.

Further, the phase of an input signal can be modulated throughout all areas in the polar coordinate system.

DESCRIPTION OF DRAWINGS

Now, the vector modulator according to non-limiting exemplary embodiments of the present invention will be described in detail with reference to the accompanying drawings. Like numbers refer to like elements throughout and explanations that duplicate one another will be omitted.

BEST MODE FOR CARRYING OUT THE INVENTION

The present invention is described more fully hereinafter with reference to the accompanying drawings, in which embodiments of the present invention are shown. This present invention may, however, be embodied in many different forms and should not be construed as limited to the embodiments set forth herein. Rather, these embodiments are provided so that this disclosure is thorough, and will fully convey the scope of the present invention to those skilled in the art.

It will be understood that, although the terms "first," "second," etc. may be used herein to describe various elements, these elements should not be limited by these terms. These terms are only used to distinguish one element from another element. Thus, a "first" element discussed below could also be termed as a "second" element without departing from the teachings of the present invention.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

The terminology used herein is for the purpose of describing particular embodiments only and is not intended to be limiting of the invention. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Figure 1:
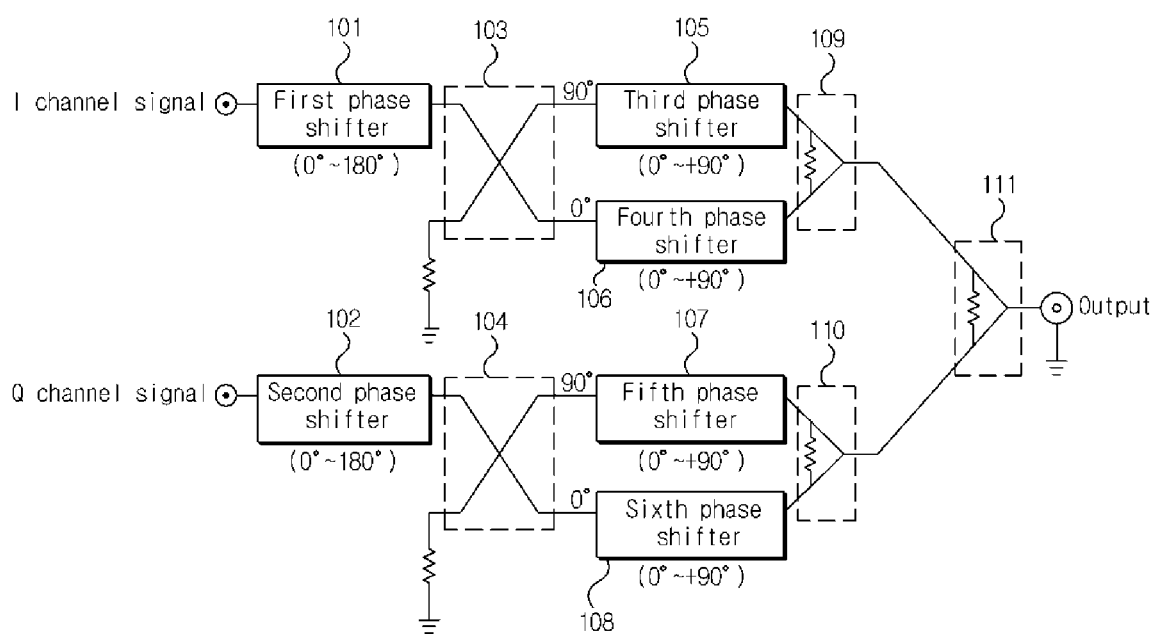
FIG. 1 is a schematic configuration diagram of a vector modulator according to an embodiment of the present invention.

FIG. 1 is a schematic configuration diagram of a vector modulator according to an embodiment of the present invention.

Referring to FIG. 1, the vector modulator according to this embodiment includes first and second phase shifters 101 and 102, first and second couplers 103 and 104, third to sixth phase shifters 105, 106, 107 and 108, and first to third combiners 109, 110 and 111.

The first phase shifter 101 shifts the phase of an in-phase (I) channel signal I constituting an input signal having arbitrary amplitude and phase to a predetermined phase (I'). In this embodiment, the first phase shifter 101 shifts a phase within a phase range of 0 to 90 degrees.

Similarly to the first phase shifter 101, the second phase shifter 102 shifts the phase of a quadrature (Q) channel signal Q constituting the input signal to a predetermined phase (Q'). In this embodiment, the second phase shifter 102 shifts a phase within a phase range of 0 to 90 degrees.

Here, the I channel signal I and the Q channel signal Q have a predetermined phase difference, preferably a phase difference of 90 degrees with each other. The first and second phase shifters 101 and 102 shift the phases of the I and Q channel signals I and Q while maintaining the amplitudes of the corresponding channel signals, respectively.

The first coupler 103 converts an I channel signal I' output from the first phase shifter 101 into first and second channel signals $I_1'$ and $I_2'$ having a phase difference of 90 degrees with each other, and outputs the first and second channel signals $I_1'$ and $I_2'$.

The second coupler 104 converts an Q channel signal Q' output from the second phase shifter 101 into third and fourth channel signals $Q_1'$ and $Q_2'$ having a phase difference of 90 degrees with each other, and outputs the third and fourth channel signals $Q_1'$ and $Q_2'$.

As an embodiment of the present invention, the first and second couplers 103 and 104 may be implemented as a 90-degree hybrid coupler.

The third and fourth phase shifters 105 and 106 shift the phases of the respective first and second channel signals $I_1'$ and $I_2'$ output from the first coupler 103 within a predetermined phase range ($I_1''$ and $I_2''$).

The fifth and sixth phase shifters 107 and 108 shift the phases of the respective third and fourth channel signals $Q_1'$ and $Q_2'$ output from the second coupler 104 within a predetermined phase range ($Q_1''$ and $Q_2''$).

Here, the third to sixth phase shifters 105 to 108 shift the phases of the respective corresponding channel signals within a phase range of 0 to 90 degrees. In this case, the amplitude of each corresponding channel signal is maintained as it is.

The first combiner 109 combines a first channel signal $I_1''$ of which phase is shifted and output from the third phase shifter 105 with a second channel signal $I_2''$ of which phase is shifted and output from the fourth phase shifter 106, and outputs a combined signal $I_f$. In this case, the combination of the channel signals is implemented as a vector sum. The amplitude and phase of the I channel signal combined as described above are changed as compared with those of the initial I channel signal input to the first phase shifter 101.

The second combiner 110 combines a third channel signal $Q_1''$ of which phase is shifted and output from the fifth phase shifter 107 with a fourth channel signal $Q_2''$ of which phase is shifted and output from the sixth phase shifter 108, and outputs a combined signal $Q_f$. In this case, the combination of the channel signals is implemented as a vector sum. The amplitude and phase of the Q channel signal combined as described above are changed as compared with those of the initial Q channel signal input to the second phase shifter 102.

The third combiner 111 finally combines the I channel signal $I_f$ combined and output from the first combiner 109 with the Q channel signal $Q_f$ combined and output from the second combiner 110, and outputs a combined signal. In this case, the combination of the channel signals is implemented as a vector sum. The amplitude and phase of the output signal finally combined as described above are changed as those of the input signal.

As described above, in the present invention, each of the I/Q channel signals constituting the input signal is converted into two signals having a phase difference of 90 degrees with each other. The phases of the two signals are shifted while maintaining the amplitudes of the two signals, and the two signals are then combined with each other, thereby outputting I/Q channel signals of which amplitudes and phases are changed. The output I/Q channel signals are again combined with each other, thereby generating an output signal of which amplitude and phase are changed as compared with those of the input signal.

As such, the present invention generates a new output signal by modulating the amplitude and phase of an input signal within a phase shift range predetermined for each phase shifter, so that it is possible to implement a vector modulator having a simpler configuration.

Figure 2:
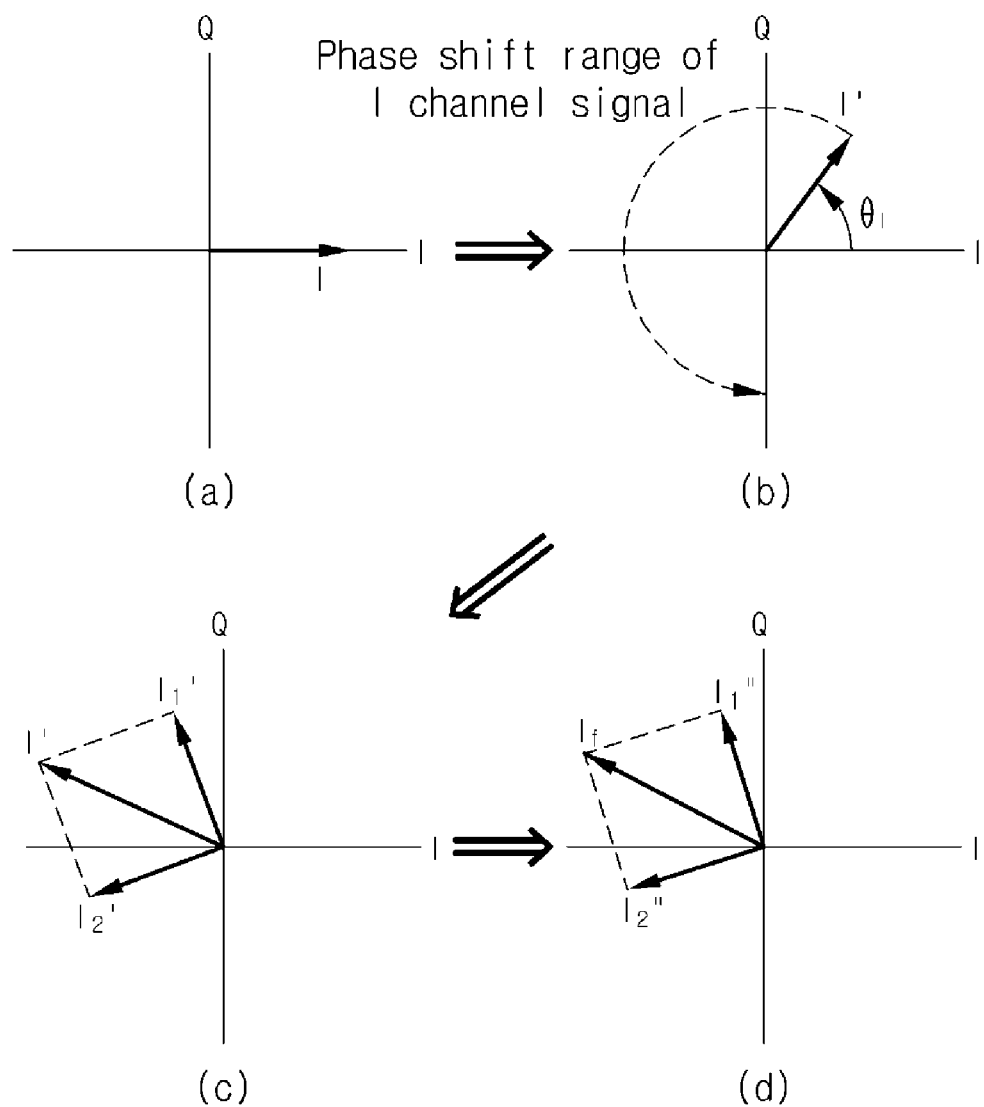
FIG. 2 is an exemplary vector diagram illustrating a process of processing an in-phase (I) channel signal according to the embodiment of the present invention.

FIG. 2 is an exemplary vector diagram illustrating a process of processing an I channel signal according to the embodiment of the present invention.

As shown in FIG. 2(a), if an I channel signal I constituting an input signal having arbitrary amplitude and phase is input to the first phase shifter 101, the first phase shifter 101 shifts the phase of the I channel signal I within a phase range of 0 to 90 degrees while maintaining the amplitude as shown in FIG. 2(b), and outputs an I channel signal I' of which phase is shifted. In FIG. 2(b), the phase of the I channel signal I is shifted by $\theta_I$ and the I channel signal I' having the shifted phase exists in the first quadrant.

Subsequently, as shown in FIG. 2(c), the I channel signal I' having the shifted phase is converted into first and second channel signals $I_1$' and $I_2$' having a phase difference of 90 degrees with each other by passing through the first coupler 103. Thus, the first and second channel signals $I_1$' and $I_2$' are output.

Subsequently, as shown in FIG. 2(d), the first channel signal $I_1$' has a shifted phase and no change in amplitude by passing through the third phase shifter 105, and the second channel signal $I_2$' has a shifted phase and no change in amplitude by passing through the fourth phase shifter 106. Thus, first and second channel signals $I_1$" and $I_2$" having shifted phases are output. Then, the first and second channel signals $I_1$" and $I_2$" having the shifted phases are combined as a vector sum by the first coupler 109, thereby outputting an I channel signal $I_f$ of which amplitude and phase are modulated.

Through the process described above, the initial I channel signal I constituting the input signal is output as the new I channel signal $I_f$ of which amplitude and phase are modulated.

Figure 3:
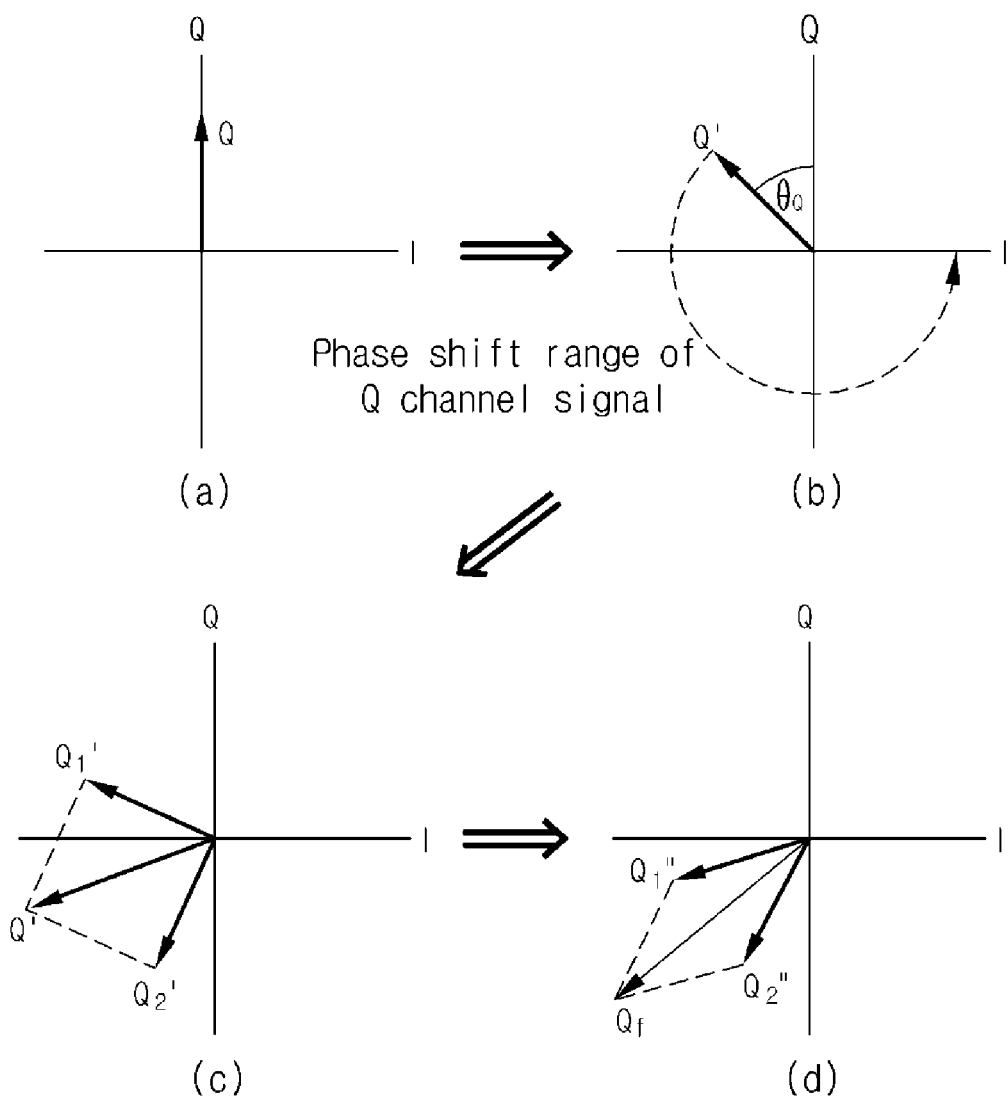
FIG. 3 is an exemplary vector diagram illustrating a process of processing a quadrature (Q) channel signal according to the embodiment of the present invention.

FIG. 3 is an exemplary vector diagram illustrating a process of processing a Q channel signal according to the embodiment of the present invention.

As shown in FIG. 3(a), if a Q channel signal Q constituting an input signal having arbitrary amplitude and phase is input to the second phase shifter 102, the second phase shifter 102 shifts the phase of the Q channel signal Q within a phase range of 0 to 90 degrees while maintaining the amplitude as shown in FIG. 3(b), and outputs a Q channel signal Q' of which phase is shifted. In FIG. 3(b), the phase of the Q channel signal Q is shifted by $\theta_Q$, and the Q channel signal Q' having the shifted phase exists in the second quadrant.

Subsequently, as shown in FIG. 3(c), the Q channel signal Q' having the shifted phase is converted into third and fourth channel signals $Q_1$' and $Q_2$' having a phase difference of 90 degrees with each other by passing through the second coupler 104. Thus, the third and fourth channel signals $Q_1$' and $Q_2$' are output. Subsequently, as shown in FIG. 3(d), the third channel signal $Q_1$' has a shifted phase and no change in amplitude by passing through the fifth phase shifter 107, and the fourth channel signal $Q_2$' has a shifted phase and no change in amplitude by passing through the sixth phase shifter 108. Thus, third and fourth channel signals $Q_1$" and $Q_2$" having shifted phases are output. Then, the third and fourth channel signals $Q_1$" and $Q_2$" having the shifted phases are combined as a vector sum by the second coupler 110, thereby outputting a Q channel signal $Q_f$ of which amplitude and phase are modulated.

Through the process described above, the initial Q channel signal Q constituting the input signal is output as the new Q channel signal $Q_f$ of which amplitude and phase are modulated.

Figure 4:
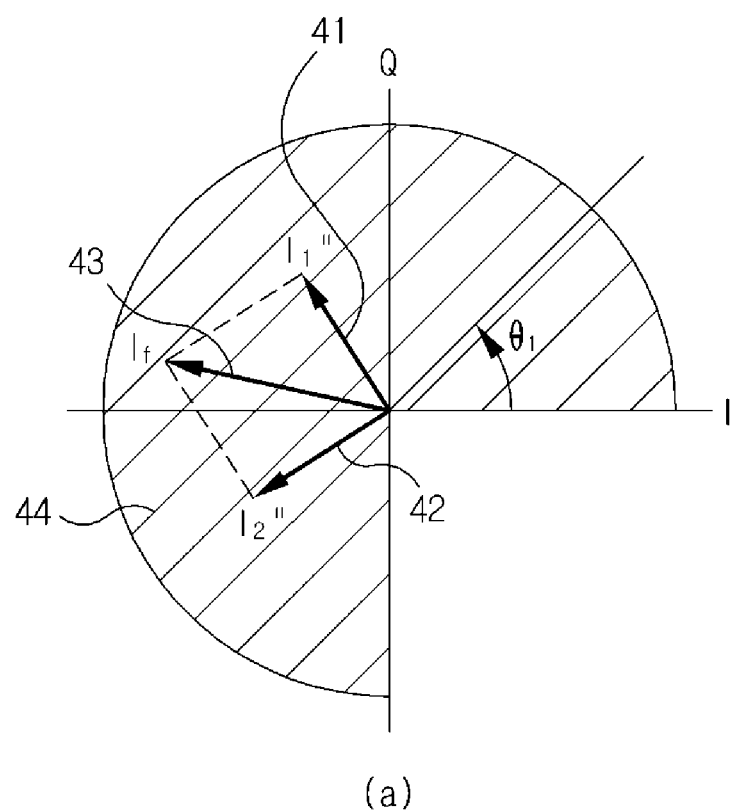
FIG. 4 is an exemplary vector diagram illustrating a phase shift area of the I channel signal according to the embodiment of the present invention.

FIG. 4 is an exemplary vector diagram illustrating a phase shift area of the I channel signal according to the embodiment of the present invention.

As shown in FIG. 4, the output characteristic of the I channel signal I according to the present invention is determined by a phase $\theta_1$ shifted in the first phase shifter 101. That is, the output characteristic of the I channel signal I is determined based on to which phase within a phase range of 0 to 90 degrees the phase of the I channel signal I is shifted in the first phase shifter 101.

Referring to FIG. 4, when assuming that the phase $\theta_1$ obtained by shifting the phase of the I channel signal I is zero degree, the third phase shifter 105 shifts the phase of the first channel signal $I_1$' within a phase range of 0 to 90 degrees, and therefore, the phase displacement of the first channel signal $I_1$' may range from 0 to 90 degrees. The fourth phase shifter 106 shifts the phase of the second channel signal $I_2$' within a phase range of 0 to 90 degrees, and the first and second channel signals have a phase difference of 90 degrees with each other. Therefore, the phase displacement of the second channel signal $I_2$' may range from 90 to 180 degrees. If the third and fourth phase shifters 105 and 106 shift the phases of the respective first and second channel signals $I_1$' and $I_2$' at the same rate, the amplitude of the I channel signal $I_f$ obtained by combining the first and second channel signals $I_1$' and $I_2$' is changed on the axis in the state in which the phase of the I channel signal $I_f$ is fixed. The phase shift area of the combined signal $I_f$ with respect to the I channel signal I may range from 0 to 270 degrees as shown in FIG. 5.

Figure 5:
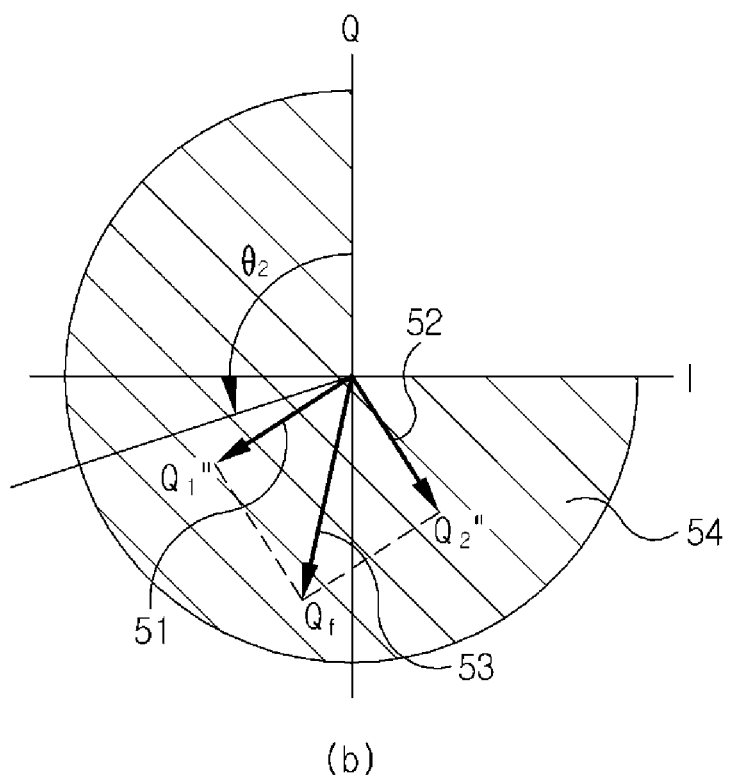
FIG. 5 is an exemplary vector diagram illustrating a phase shift area of the Q channel signal according to the embodiment of the present invention.

FIG. 5 is an exemplary vector diagram illustrating a phase shift area of the Q channel signal according to the embodiment of the present invention.

As shown in FIG. 5, the output characteristic of the Q channel signal Q according to the present invention is determined by a phase $\theta_2$ shifted in the second phase shifter 102. That is, the output characteristic of the Q channel signal Q is determined based on to which phase within a phase range of 0 to 90 degrees the phase of the Q channel signal Q is shifted in the second phase shifter 102.

Referring to FIG. 5, when assuming that the phase $\theta_1$ obtained by shifting the phase of the I channel signal I is zero degree, the I and Q channel signals I and Q have a phase difference of 90 degrees with each other, and therefore, the Q channel signal Q has a phase of 90 degrees. The fifth phase shifter 107 shifts the phase of the third channel signal $Q_1$' within a phase range of 0 to 90 degrees, and therefore, the phase displacement of the third channel signal may range from 90 to 180 degrees. The sixth phase shifter 108 shifts the phase of the fourth channel signal $Q_2$' within a phase range of 0 to 90 degrees, and the third and fourth channel signals $Q_1$' and $Q_2$' have a phase difference of 90 degrees with each other. Therefore, the phase displacement of the fourth channel signal $Q_2$' may range from 180 to 270 degrees. If the fifth and sixth phase shifters 107 and 108 shift the phases of the respective third and fourth channel signals $Q_1$' and $Q_2$' at the same rate, the amplitude of the Q channel signal $Q_f$ obtained by combining the third and fourth channel signals $Q_1$' and $Q_2$' is changed on the axis in the state in which the phase of the Q channel signal $Q_f$ is fixed. With the same principle as FIG. 4, the phase shift area of the combined signal $Q_f$ with respect to the Q channel signal Q may range from 90 to 360 degrees as shown in FIG. 5.

As can be seen in FIGS. 4 and 5, the present invention enables a phase shift to be performed throughout all areas in the polar coordinate system that is an I/Q vector diagram, using a plurality of phase shifters. Further, the phases of I/Q channel signals are shifted in the phase shifters, so that the amplitude of a signal obtained by combining the I/Q channel signals can also be changed. This means that the amplitude and phase of an output signal can be modulated as those of an input signal.

Thus, in the vector modulator of the present invention, the amplitudes and phases of I and Q channel signals constituting an input signal having arbitrary amplitude and phase are changed through phase shifters, respectively, and an output signal of which amplitude and phase are modulated are output by finally combining the I and Q channel signals having the changed amplitudes and phases.

Accordingly, in the vector modulation of the present invention, a signal can be modulated not using a plurality of amplitude variable attenuators in the conventional vector modulator but using only phase shifters, so that it is possible to simplify the configuration and circuit of the vector modulator and to perform modulation throughout all areas in the polar coordination system.

Although the present invention has been explained by the embodiments shown in the drawings described above, it should be understood to the ordinary skilled person in the art that the present invention is not limited to the embodiments but rather that various changes or modifications thereof are possible without departing from the spirit of the present invention. Accordingly, the scope of the present invention shall be determined only by the appended claims and their equivalents.

INDUSTRIAL APPLICABILITY

Vector modulators are widely used in various fields including measuring machines, wireless transceivers, amplifiers, etc. Such a vector modulator outputs an input signal as I/Q signals, and controls the amplitude and phase of the input signal by controlling only the phases of the I/Q signals while maintaining the amplitudes of the I/Q signals as they are. As the high performance, simplification and cost saving of electronic and electrical products have become important in recent years, interest in modules or components used in these products is also increased.

From such a point of view, the I/Q vector modulator of the present invention is configured not to use amplitude variable attenuators in the conventional vector modulator but to use phase shifters, so that it is possible to simplify the configuration of the vector modulator and to save cost. Thus, the present invention can be usefully applied in various industrial fields using I/Q vector modulators.

The invention claimed is:
1. A vector modulator, comprising:
a first phase shifter configured to shift a phase of an in-phase (I) channel signal of an input signal within a first predetermined phase range;
a second phase shifter configured to shift a phase of a quadrature (Q) channel signal of an input signal within a second predetermined phase range;
a first coupler configured to convert the phase-shifted I channel signal into first and second channel signals having a 90 degree phase difference;
a second coupler configured to convert the phase-shifted Q channel signal into third and fourth channel signals having a 90 degree phase difference;
a third phase shifter configured to shift the phase of the first channel signal within a third predetermined phase range;
a fourth phase shifter configured to shift the phase of the second channel signal within a fourth predetermined phase range;
a fifth phase shifter configured to shift the phase of the third channel signal within a fifth predetermined phase range;
a sixth phase shifter configured to shift the phase of the fourth channel signal within a sixth predetermined phase range;
a first combiner configured to combine the phase-shifted first channel signal and the phase-shifted second channel signal into a combined I channel signal ($I_f$);
a second combiner configured to combine the phase-shifted third channel signal and the phase-shifted fourth channel signal into a combined Q channel signal ($Q_f$); and
a third combiner configured to combine signals output from the first and second couplers,
wherein a phase-shift area of the combined channel signal $I_f$ is within a range of 0 to 270 degrees, and
wherein a phase-shift area of the combined channel signal $Q_f$ is within a range of 90 to 360 degrees.

2. The vector modulator of claim 1, wherein each of the first phase shifter, second phase shifter, third phase shifter, fourth phase shifter, fifth phase shifter and sixth phase shifter is further configured to shift a phase of a received signal while maintaining an amplitude of the received signal.

3. The vector modulator of claim 1, wherein each of the first phase shifter, second phase shifter, third phase shifter, fourth phase shifter, fifth phase shifter and sixth phase shifter is further configured to shift a phase of a received signal within a phase range of 0 to 90 degrees.

4. The vector modulator of claim 1, wherein each of the first combiner, second combiner and third combiner is further configured to combine received signals as a vector sum.

5. The vector modulator of claim 1, wherein each of the first coupler and second coupler is a 90-degree hybrid coupler.

* * * * *